United States Patent
Hauf

(10) Patent No.: US 6,462,315 B2
(45) Date of Patent: *Oct. 8, 2002

(54) OPTICAL RADIATION MEASUREMENT APPARATUS

(75) Inventor: Markus Hauf, Ichenhausen (DE)

(73) Assignee: Steag AST (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/208,954

(22) Filed: Dec. 8, 1998

(65) Prior Publication Data

US 2001/0038005 A1 Nov. 8, 2001

(30) Foreign Application Priority Data

| Dec. 8, 1997 | (DE) | ......................... | 197 54 385 |
| Jun. 24, 1998 | (DE) | ......................... | 198 28 135 |
| Nov. 12, 1998 | (DE) | ......................... | 198 52 321 |

(51) Int. Cl.[7] ............................................... H05B 1/02
(52) U.S. Cl. ................. 219/502; 219/390; 374/121; 374/130; 392/416; 392/418; 392/420
(58) Field of Search .................. 219/390, 502, 219/469, 216; 374/121–133, 144; 392/418, 416, 420; 702/134, 135; 250/367, 366, 339.02; 118/725

(56) References Cited

U.S. PATENT DOCUMENTS

| 3,805,020 A | * | 4/1974 | Bates | ......................... | 219/469 |
| 4,075,455 A | * | 2/1978 | Kitamura et al. | ........... | 219/216 |
| 4,435,093 A | * | 3/1984 | Krause et al. | .............. | 374/129 |
| 4,764,025 A | * | 8/1988 | Jensen | ....................... | 374/144 |
| 4,766,315 A | * | 8/1988 | Hellstrom et al. | ..... | 250/339.02 |
| 4,979,133 A | * | 12/1990 | Arima et al. | ............... | 702/134 |
| 4,979,134 A | * | 12/1990 | Arima et al. | ............... | 702/135 |
| 5,156,461 A | * | 10/1992 | Moslehi et al. | ............ | 374/121 |
| 5,156,820 A | * | 10/1992 | Wong et al. | .......... | 422/186.05 |
| 5,165,796 A | * | 11/1992 | Gat et al. | .................... | 374/128 |
| 5,180,226 A | * | 1/1993 | Moslehi | ....................... | 374/127 |
| 5,255,286 A | * | 10/1993 | Moslehi et al. | ............ | 374/121 |
| 5,373,162 A | * | 12/1994 | Akai | ......................... | 250/366 |
| 5,386,491 A | * | 1/1995 | Mewissen et al. | .......... | 392/418 |
| 5,624,590 A | * | 4/1997 | Fiory | ........................ | 219/390 |
| 5,660,472 A | * | 8/1997 | Peuse et al. | ................ | 374/128 |
| 5,830,277 A | * | 11/1998 | Johnsgard et al. | .......... | 118/725 |
| 5,848,842 A | * | 12/1998 | Peuse et al. | .................... | 374/1 |
| 6,016,383 A | * | 1/2000 | Gronet et al. | ............... | 392/416 |
| 6,027,244 A | * | 2/2000 | Champetier et al. | ....... | 374/130 |
| 6,122,440 A | * | 9/2000 | Campbell | .................... | 392/420 |

FOREIGN PATENT DOCUMENTS

| DE | 4407893 | * | 7/1995 |
| JP | 359187232 A | * | 10/1984 |
| JP | 405259082 A | * | 10/1993 |

* cited by examiner

Primary Examiner—Teresa Walberg
Assistant Examiner—Quang Van
(74) Attorney, Agent, or Firm—R.W. Becker & Assoc.; R. W. Becker

(57) ABSTRACT

An optical radiation measurement apparatus is provided. The apparatus has at least one radiation detector for measuring electromagnetic radiation emitted from at least two radiation sources. Separate radiation channels are provided in a channel member in order to provide a radiation path between the radiation sources and the radiation detector, which is common to all of the radiation sources.

28 Claims, 6 Drawing Sheets

OPTICAL RADIATION MEASUREMENT APPARATUS

BACKGROUND OF THE INVESTIGATION

Figure 1:
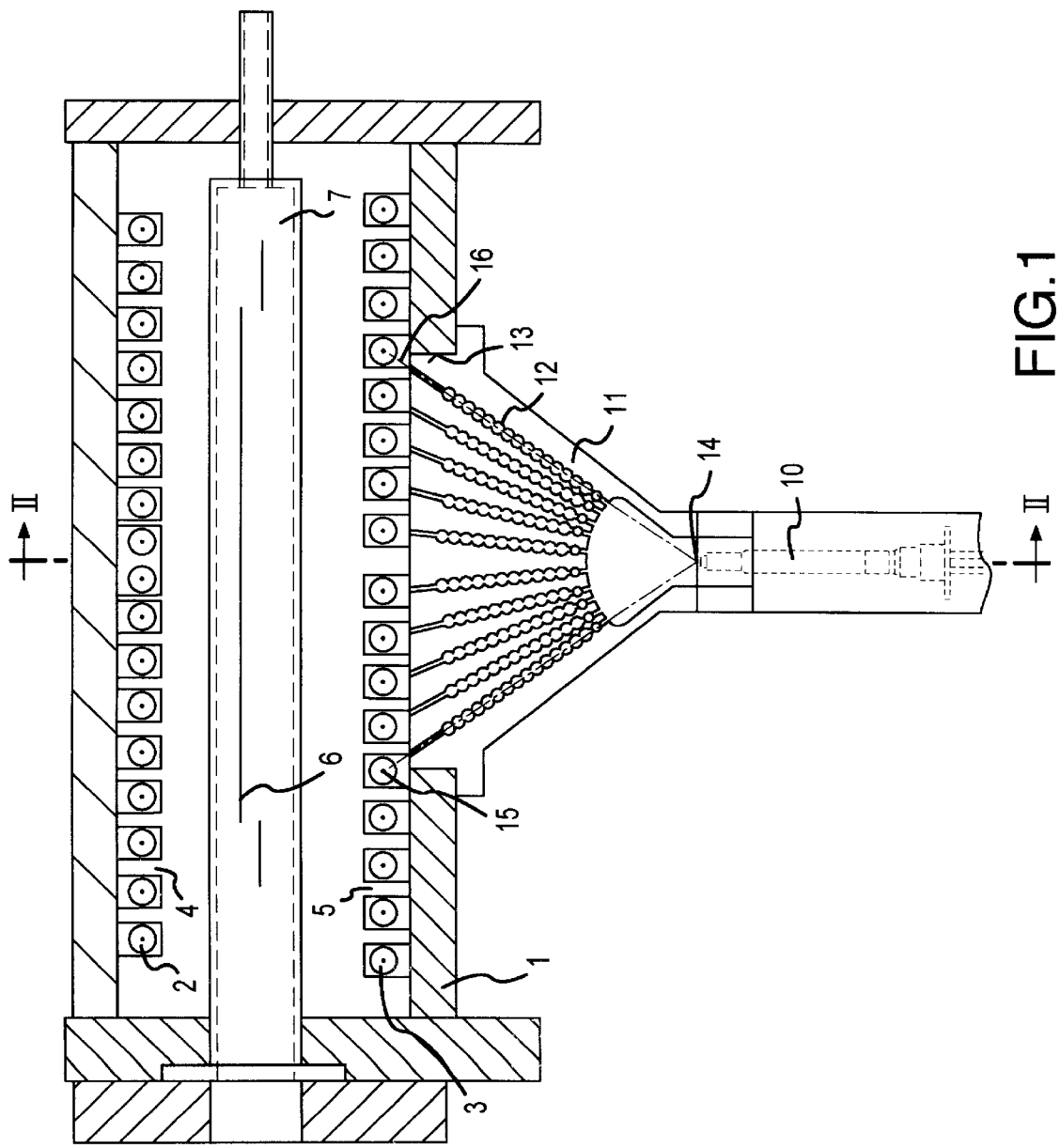

The present invention relates to an optical apparatus having at least one radiation deflector for measuring electromagnetic radiation emitted from at least two radiation sources.

Apparatus of this type are known, for example, in conjunction with rapid heating furnaces for the thermal treatment of semiconductor substrates for manufacturing semiconductor chips. In order to be able to measure the parameters and characteristics, such as the temperature, the emissivity, the reflectivity, the transmissivity and/or the characteristics or thickness of a layer that is to be applied to the semiconductor substrate during the thermal treatment, the radiation coming from the semiconductor substrate is measured as is the radiation that is emitted from the radiation sources provided for heating up the semiconductor substrates. By comparing the two measured radiation values it is possible to differentiate between the radiation emitted from the semiconductor substrate and the reflected radiation. Apparatus and methods of this type are known, for example, from U.S. Pat. No. 5,490,728, where light lines are used in order to guide the respective radiation, and in particular also the radiation given off by the radiation sources, to radiation detectors. The inlet openings of these light lines, however, have a large and undefined opening angle, so that also a relatively great amount of background radiation is taken in and falls upon the radiation detector. As a consequence, the measured values—if at all—indicate little and are not specific with respect to the actual radiation coming from the radiation sources.

Furthermore, from DE 93 12 231 an apparatus for measuring UV radiation is known where a photo diode for measuring UV radiation emitted from a radiation source is provided in a cylindrical housing having an opening. The opening is partially closed off by a restrictor that forms a radiation channel.

Reference is further made to DE 31 29 065, which discloses a device for the photoelectric monitoring of a flow medium, where a light source and a direct light receiver disposed opposite the light source are provided and the light receiver is disposed in a receiver bus having a light line channel. DE 39 08 627 furthermore discloses a multi-element infrared detector where in front of each detector element there is disposed a light line in the form of light conducting channels formed in a channel plate, with the dimensions of the channels effecting a dampening of radar radiation. In addition, disposed in front of the channel plate is a shutter or aperture plate which has openings that are aligned with the light conductive channels and have non-reflective inner surfaces. FR 2 707 005 finally discloses a semicircular photo detector arrangement where light conducting channels are disposed in a semicircular carrier member, and a respective photo detector is provided at the ends of the light channels.

It is therefore an object of the present invention to provide an optical radiation measurement apparatus which with straightforward means enables a substantially more precise determination of the electromagnetic radiation emitted from the radiation sources.

Starting from an optical radiation measurement apparatus of the aforementioned general type, this objective is inventively realized by separate radiation channels formed in a channel member for the radiation path between the radiation sources and the radiation detector, which is common for the radiation sources. The radiation channels can thereby be designed very precisely to the radiation source, so no, or only an insignificant portion of, background radiation, which would falsify the measurement result, strikes the radiation detector. As a result, the parameters, characteristics and intensities of the electromagnetic radiation emitted from the radiation sources can be determined significantly more precisely and more reliably.

Pursuant to one particularly advantageous specific embodiment of the invention, the radiation channel has a cross-sectional shape that corresponds to the shape of the radiation source. Due to this shape of the channel cross-section, and the dimensions thereof, a precise adaptation of the radiation channel to the radiation source is possible, so that independently of the shape of the radiation source the background radiation can be reliably masked out.

It is particularly advantageous if the radiation channel has a cross-sectional shape that permits a radiation passage to the radiation detector even if the radiation source deviates from the ideal position. As a result of such a formation of the channel, mechanical modifications or deviations in position of the radiation source, for example a lamp filament, which occur, for example, by vibrations, being out of adjustment, or deformations, for example during the heating process, are not reflected in signal alterations that could otherwise adversely affect the measurement result and the evaluation.

It is particularly advantageous if the radiation channel, or at least one wall of the radiation channel, is structured, for example having a wavy, grooved or corrugated, or irregular wall structure. As a result, the radiation that does not enter parallel to the axis of the radiation channel, in other words which does not originate from the radiation source, is also not guided by reflection upon the radiation detector, but rather is adsorbed. The structured channel wall therefore additionally contributes to undesired and undefined background radiation and scatter light from not falling upon the radiation detector and thereby falsifying the measurement results.

Very advantageous is furthermore an embodiment of the invention pursuant to which the radiation channel has at least one mechanism for altering the cross-sectional area of the radiation channel. By altering the cross-sectional area of the channel, the intensity, with which the radiation given off by a radiation source strikes the radiation detector, can be adjusted, which is especially advantageous if pursuant to a further specific embodiment of the invention, where a number of radiation sources are present, the relationship of the radiation of the respective lamps that strikes the radiation detector can be adjusted relative to one another by altering the cross-sectional area of the respective channel. A particularly straight forward mechanism for altering the cross-sectional area of the channel, and hence of the radiation intensity that strikes the radiation detector, is a screw that can be screwed into the radiation channel transverse to the direction of radiation. However, a variable aperture can also be used.

With some rapid heating systems for the thermal treatment of semiconductor substrates, cool air is blown in between the radiation sources in order to cool some of the elements, for example a reaction chamber. However, due to this cool air flow turbulances occur between the radiation channels and the individual radiation sources and leads to fluctuations in intensity. In order to avoid these fluctuations in intensity, the channel member, with the radiation channel or channels, extends up to the radiation source or sources.

Pursuant to one preferred specific embodiment, the radiation channel can be extended by at least one light transmissive intermediate element that extends the radiation channel and is disposed between at least one outlet opening of a radiation channel and an associated radiation source, without the channel body having to be guided to just before the radiation source. In this connection advantageously an intermediate element that in common extends a plurality of radiation channels is provided. Pursuant to one preferred embodiment of the invention, a quartz or sapphire rod is used for the extension, with which reflections are to the greatest extent possible suppressed at the inner walls so that only the light coming directly from the radiation source strikes the detector.

Pursuant to one particularly advantageous embodiment of the invention—as already mentioned—a plurality of radiation sources are disposed next to one another, and the channel member, for each radiation source, has a separate radiation channel that extends to the common radiation detector. The radiations of the individual radiation sources, accompanied by the exclusion of background radiation and reciprocal influence, are thereby reliably guided to the common radiation detector, thereby increasing the precision of measurement. If the radiation sources are, for example, individual lamps that are disposed next to one another in a row in the form of a lamp bank, as is the case, for example, with rapid heating apparatus for the thermal treatment of semiconductor substrates, the channels are formed in a fan-like fashion in the channel member between the lamps and the common radiation source.

Since the lamps are essentially disposed in a row, pursuant to a further embodiment of the invention a cylindrical lens is disposed between the ends of the radiation channels that face the radiation detector and the radiation detector, with the lens focusing on the radiation detector the radiation of the individual radiation sources that in a fan-like fashion feeds the radiation detector.

The inventive radiation measurement apparatus can be used with great advantage in conjunction with a rapid heating furnace for the thermal treatment of semiconductor substrates.

Figure 2:
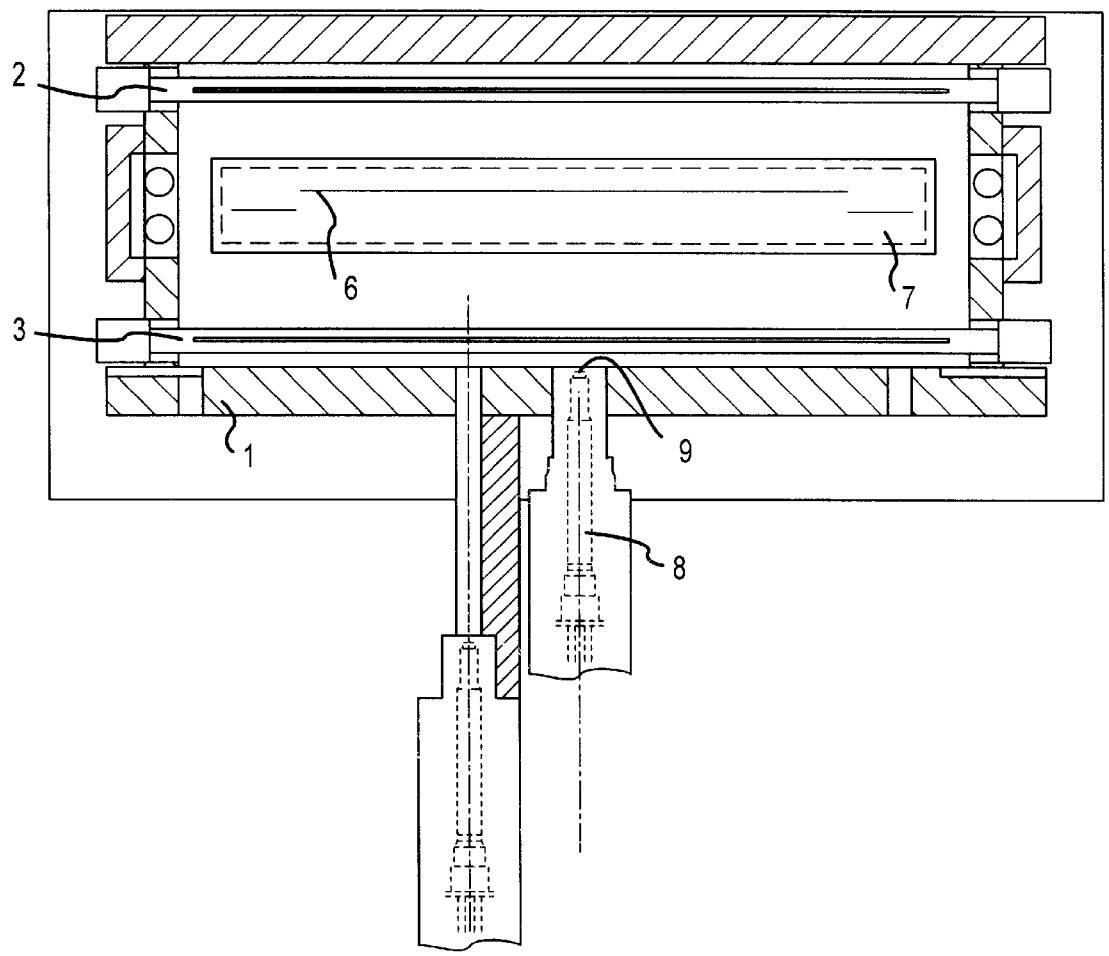
Figures 3, 4, 5:
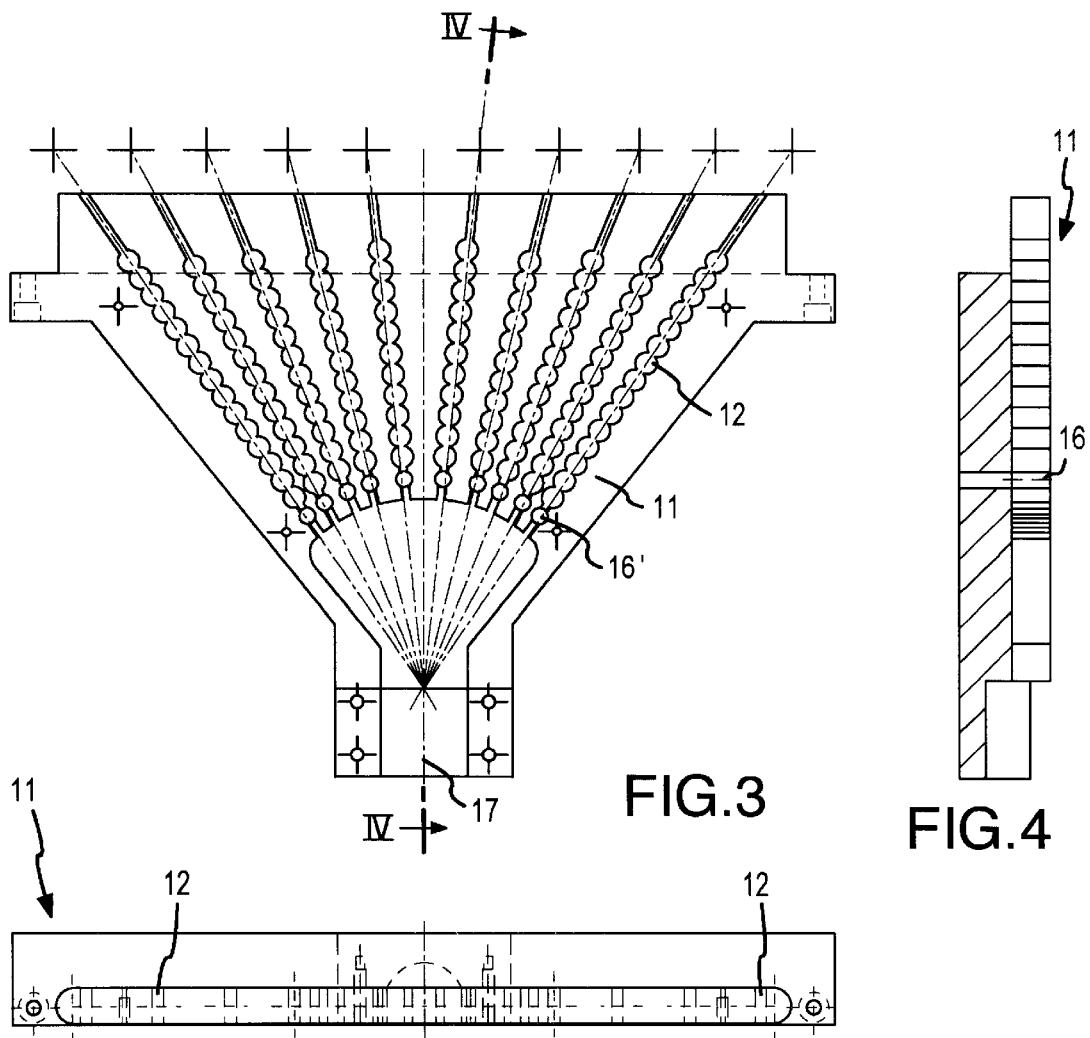
Figure 6:
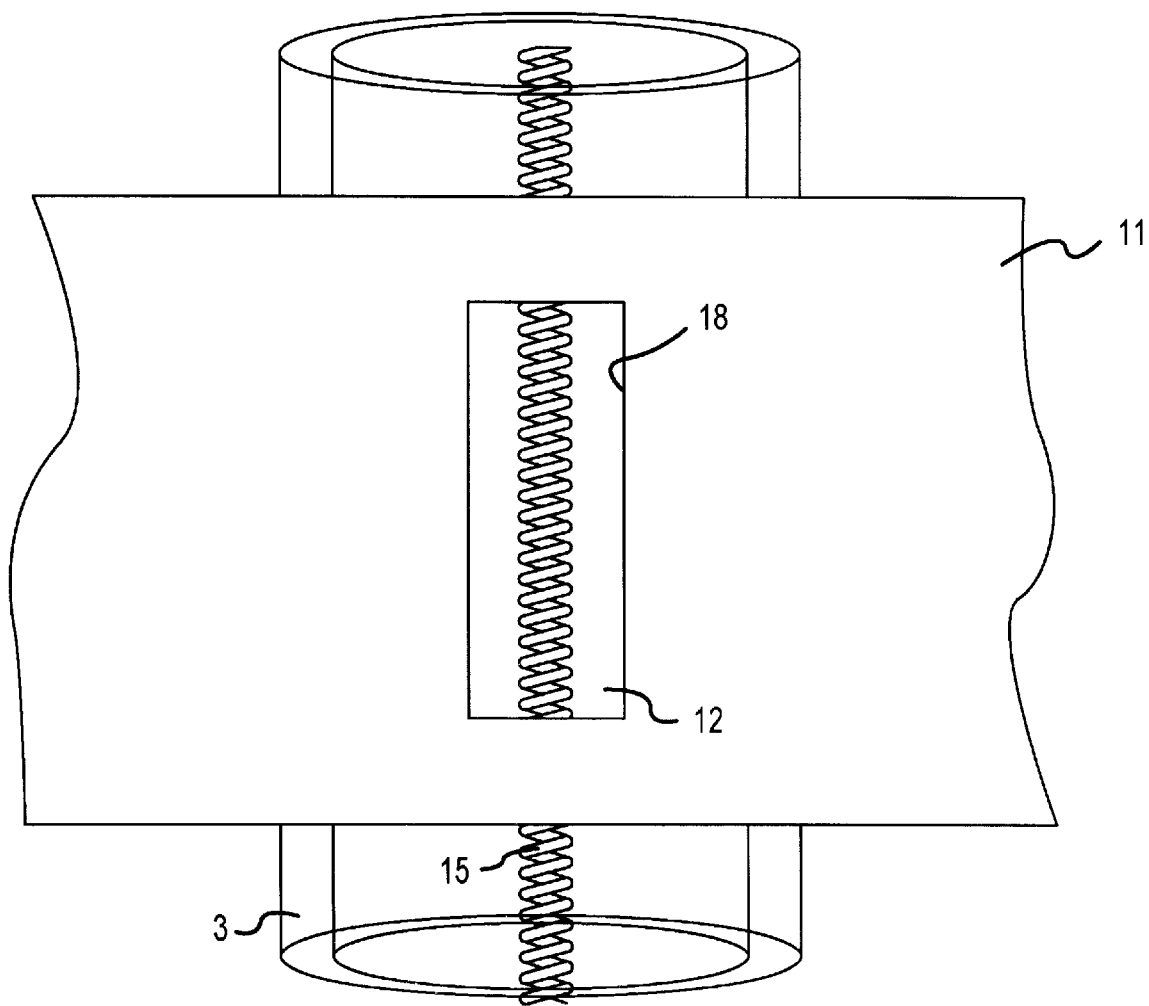
Figure 6A:
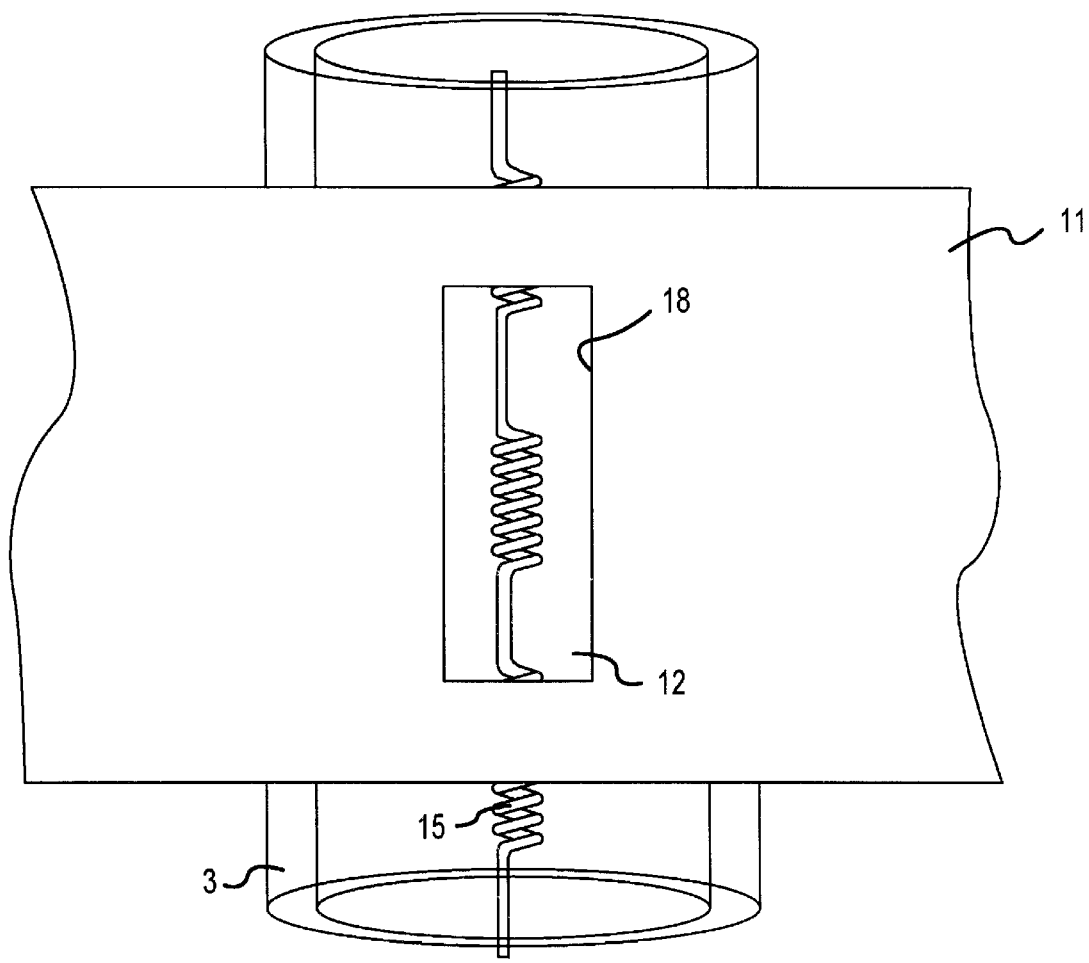
Figure 7:
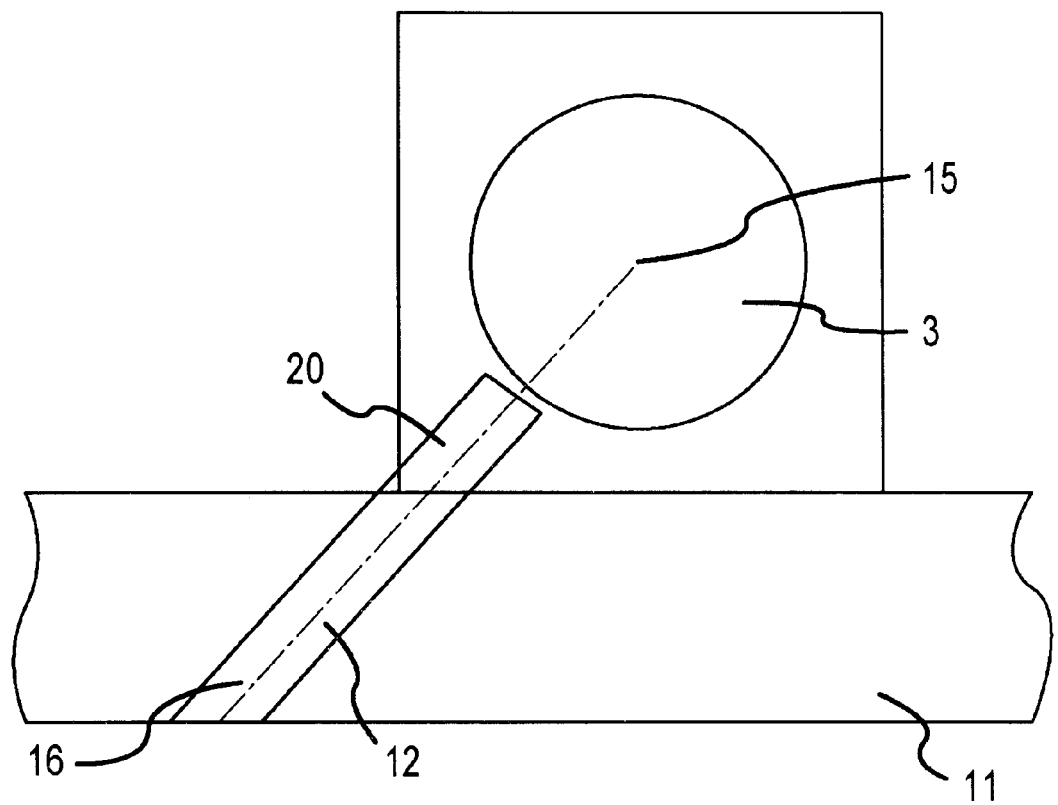

The invention will be explained subsequently with the aid of one preferred embodiment where the radiation measurement apparatus is used in conjunction with a rapid heating furnace for the thermal treatment of semiconductor substrates and in conjunction with the drawings, which show:

FIG. 1 a schematic longitudinal sectional illustration through a rapid heating furnace utilizing the inventive radiation measurement apparatus, FIG. 2 a cross-sectional view along the line II—II in FIG. 1, FIG. 3 an enlarged schematic cross-sectional illustration of the radiation channel member illustrated in FIGS. 1 and 2, FIG. 4 a cross-sectional illustration taken along the line IV—IV in FIG. 3, FIG. 5 a partial cross-sectional illustration of the radiation channel member looking in the direction of the narrow side of the radiation channel member that faces the lamps, FIG. 6 an enlarged partial illustration of the radiation channel member to explain the orientation and arrangement of the radiation channels relative to a lamp, and FIG. 7 an enlarged partial illustration of the region between an outlet opening of a radiation channel and a radiation source to explain a further exemplary embodiment of the invention.

DESCRIPTION OF PREFERRED EMBODIMENTS

The rapid heating furnace illustrated in FIGS. 1 and 2 has a housing 1 on the upper and lower inner wall of which are respectively mounted a bank 4, 5 of lamps comprising a number of individual lamps or individual lamp tubes 2, 3, with these banks of lamps heating up a semiconductor wafer 6 that is disposed in a reaction chamber 7 in the housing 1 between the banks 4, 5 of lamps.

The reaction chamber 7 is advantageously essentially comprised of a material that is essentially transparent for the lamp radiation, and that is also transparent with respect to the measuring wavelengths or the measuring wavelength spectra of the pyrometer or the radiation detectors that are used. With quartz glasses and/or sapphire, which have an absorption coefficient, averaged over the lamp spectrum, of about $0.1$ $cm^{-1}$ to $0.001$ $cm^{-1}$, suitable reaction chambers for rapid heating systems can be constructed where the thickness of the reaction chamber wall can be between 1 mm and several centimeters, for example 5 cm. Depending upon the thickness of the reaction chamber wall, the selection of the material can be effected with regard to the absorption coefficient.

Chamber walls having thicknesses in the range of centimeters are then required in particular if in the reaction chamber 7 a vacuum (up to the ultra-high vacuum) or an overpressure is to be generated. If the diameter of the reaction chamber is, for example, about 300 mm, then with a quartz glass thickness of about 12 mm to 20 mm an adequate mechanical stability of the chamber 7 is achieved, so that this chamber can be evacuated. The thickness of the reaction chamber wall is designed in conformity with the material of the wall, the size of the chamber, and the pressure loads.

The lamps are preferably halogen lamps, the filaments of which at least partially have a helical or coiled structure. By means of an at least partial helical structure, advantageously a specific predefined geometrical and spectral radiation profile of the lamp can be achieved. In this connection, the filament of the lamp can, for example, alternately include coiled and uncoiled filament sections. The radiation profile (not only the geometrical but also the spectral) is in this case essentially determined by the spacing between adjacent coiled filament sections. A further possibility for defining the lamp radiation profile consists, for example, in varying the density of the filament structure (for example the coil density) along the filament.

If the lamp profile is to be controllable, advantageously lamps, preferably rod lamps, having a number of individually controllable filaments can be used. Lamps with controllable lamp profile are particularly advantageous in rapid heating units for the thermal treatment of large-surface substrates, for example 300 mm semiconductor wafers, since with these lamps and a suitable lamp control mechanism a very homogeneous temperature profile can be achieved along the surface of the substrate. As a consequence of the superposition of the individual radiation profiles of the filaments there results an overall radiation profile of the lamp that is controllable over a wide range. In the simplest case, for example a halogen lamp, such a lamp includes two filaments, for example each with a helical structure or an at least partially coiled structure, whereby the coil density and/or the spacing between the coiled filament sections of the first filament increases from the first end to the second end of the lamp, and the coil density and/or the spacing of the coiled element sections of the second filament correspondingly decrease in the reverse order from the first to the second end of the lamp. The overall radiation profile can thus be varied over a wide range by the selection of the current strength in the two filaments. A further possibility for embodying a lamp with controllable radiation profile consists in providing the filament of the lamp with at least three electrical connections, whereby between each two connections different operating voltages are applied. In this way, the filament temperature, and hence the radiation characteristic of a lamp, can be controlled along sections of the filament.

As an alternative to the previously described lamps, plasma or arc lamps can also be used, whereby here also the radiation profile can be controlled. Thus, for example, the lamp spectrum can be adjusted via the current density from the UV region up to the near infrared.

From FIG. 2 it can be seen that a wafer pyrometer 8, which is disposed on the underside of the housing 1, measures electromagnetic radiation, which is emitted and reflected from the wafer 6, via a small opening 9 that preferably, however not necessarily, is formed in the center of the wafer 6 that is to be treated in a wall of the housing. However, it is also possible to use a plurality of wafer pyrometers that are disposed parallel to the axis of the lamp.

Apparatus of the previously described type are known, for example, from U.S. Pat. No. 5,490,728. Furthermore, such a device is described in the non-published DE 197 37 802 A and in DE 197 54 386.3 of the applicant and having the same filing date, which in order to avoid repetition are incorporated by reference to the extent relevant to the present specification.

Disposed on the underside of the rapid heating furnace is an inventive optical radiation measurement apparatus that comprises a pyrometer 10 and a channel member 11, in which are formed or molded radiation channels 12, as will be discussed in detail subsequently with the aid of FIGS. 3 to 5.

As can be seen in FIGS. 1 to 5, when viewed in a longitudinal section the channel member 11 has the shape of a fan, which in cross-section is disc or plate shaped. The channel member 11 is disposed in a corresponding recess 13 in the upper or lower wall of a housing, and is fastened to the housing 1. On that side of the channel member 11 facing away from the lamp bank 5 an optical lens 14, preferably a cylinder lens, is disposed in such a way that its focal point is located at or in the vicinity of a position at which the axes of the radiation channels 12 intersect, so that the radiation that strikes the optical lens 14 enters the pyrometer 10.

As can be best seen in FIG. 1, the radiation channels 12 are formed or orientated in the channel member 11 in such a way that the respective filaments 15 of the individual lamps 3 lie on the extended longitudinal axes 16 of the respective radiation channel 12. The pyrometer 10 or its optical lens 14 therefore precisely "sees" the respective lamp filament 15, as a result of which background radiation, which does not come from the lamp filament 15,—if at all—is only a negligibly small percentage of the entire light that falls upon the pyrometer 10.

The channel member 11 is shown enlarged in FIG. 3. From here, it can be seen that the walls of the radiation channels 12 are structured, for example are provided with small curved portions that prevent scattered radiation from reaching the pyrometer 10. The radiation channels 12, with appropriate structuring, are formed in the channel member 11 by means of milling.

Disposed in the vicinity of those ends of the radiation channels 12 that face the pyrometer 10 are respective screws 16' that can be screwed to a greater or lesser degree into the radiation channels 12 and thereby alter the diameter of the radiation channels 12, so that the intensity of the radiation passing through the respective radiation channel 12 can be altered or adjusted. As a result, it is possible to essentially set every desired relationship between the radiation intensities of the individual lamps 3 that fall upon the pyrometer 10.

Provided that the lamps respectively have the same radiation intensity, more radiation intensity reaches the pyrometer 10 via the radiation channel 12 disposed the closest to the central axis 17 of the channel member 11 than does via the more outwardly disposed radiation channels 12. In order to compensate for this, the cross sectional area of the more inwardly disposed radiation channels 12 can be made smaller by screwing the screws 16' in further, thereby balancing the different radiation intensities that fall upon the pyrometer 10. Every desired relationship of the radiation intensities relative to one another can also be set in this manner.

As schematically illustrated in the exemplary embodiment of FIG. 6, the diameters or cross-sectional areas of the radiation channels 12 are optimally adapted to the shape of the lamps 3 or their elements 15, which contributes to further reducing the background or scattered radiation that falls upon the pyrometer 10. The orientation of the channel 12 in the channel member 11 or the channel window in the channel member 11 is pursuant to FIG. 6 selected with regard to dimensions in such a way that the filament is still disposed within the channel window 18 even if the filament 15 vibrates or oscillates, or becomes deformed for example during the heating process. This ensures that the light intensity that falls upon the lamp pyrometer 10 is not altered by oscillations, vibration or deformations of the filament 15, and the measurements and precision of measurements are not adversely affected.

In general, the radiation sources and/or the radiation channels are preferably disposed in such a way that the lamp pyrometer signal results from a lamp or filament section that is free of filament holding mechanisms or other means that adversely affect the radiation flux or the temperature of the filament or lamp portion observed through the radiation channels.

Whereas the lamp pyrometer 10 has optical lenses 14 with cylindrical lenses, the wafer pyrometer 8 (FIG. 2) can be provided with a round lens, a cylindrical lens or other lens-like means (e.g. zone plates, Fresnel lenses), whereby the means can be correlated in conformity with the radiation geometry of a lens. It is, for example, for a lamp bank of parallel rod lamps advantageous to utilize a cylinder lens with a cylinder axis orientated parallel to the lamps. In general, in this way as large a space as possible, and hence for example a hemispherical reflection of the wafer 6, is measured in an as unlimited a fashion as possible.

FIG. 7 shows a further exemplary embodiment of the present invention wherein an intermediate element 20, such as a quartz or sapphire rod, which extends the radiation channel 12, is disposed between the exit opening of the radiation channel 12 and the lamp 3. The purpose of this element 20 is to extend the radiation channel to just before the lamp, whereby the gap between the end of the element and the lamp is of the order of only a few millimeters. This prevents that flow turbulence that can occur between the exit opening of the respective channel 12 and the associated lamp 3 generate fluctuations in intensity during the measurement process.

Although the extension element 20 is illustrated as a rod, it is also possible to dispose a single quartz element over the entire range of the fan between the wall of the housing and the lamps. It is also possible to extend the fans to shortly before the lamps.

The present invention has in the a foregoing been described in conjunction with one preferred exemplary embodiment. To one skilled in the art a number of modifications and embodiments are possible without deviating from the inventive concept. For example, the use of the inventive optical radiation measurement apparatus is not limited to rapid heating systems for the thermal treatment of wafers. Depending upon the arrangements, forms and embodiments of the radiation sources, other channel member shapes in addition to fan shapes are possible. In addition, the configuration of the radiation channels 12 is not limited to the specific embodiment illustrated in FIG. 3.

The specification incorporates by reference the disclosure of German priority document 197 54 385.5 of Dec. 8, 1997, 198 28 135.8 of Jun. 24, 1998 and 198 52 321.1 of Nov. 12, 1998.

The present invention is, of course, in no way restricted to the specific disclosure of the specification and drawings, but also encompasses any modifications within the scope of the appended claims.

What I claim is:

1. An optical radiation measurement apparatus comprising:
   at least two radiation sources;
   a single radiation detector for measuring electromagnetic radiation emitted from said at least two radiation sources; and
   a channel member in which are provided separate radiation channels to provide a radiation path between said radiation sources and said single radiation detector, wherein said single radiation detector is common to all of said radiation sources.

2. An apparatus according to claim 1, wherein said radiation channels have a cross-sectional shape that corresponds to a shape of said radiation sources.

3. An apparatus according to claim 1, wherein said radiation channels have a cross-sectional shape that permits a radiation passage to said radiation detector even if said radiation sources deviate from an ideal position thereof.

4. An apparatus according to claim 1, wherein at least one wall of said radiation channels is structured.

5. An apparatus according to claim 4, which includes at least one means for varying the cross-sectional area of at least one of said radiation channels.

6. An apparatus according to claim 5, wherein said means for varying a cross-sectional area of said radiation channels comprises a screw that can be screwed into a radiation channel transverse to a direction of radiation.

7. Apparatus according to claim 1, wherein a plurality of radiation sources are disposed next to one another and said channel member, for each of said radiation sources, has a separate radiation channel that is directed toward said single radiation detector.

8. An apparatus according to claim 7, wherein said radiation sources are individual lamps that are disposed next to one another in a row as a lamp bank and wherein said radiation channels are disposed in a fan-like fashion in said radiation member between said lamps and said single radiation detector.

9. An apparatus according to claim 7, wherein a relationship of the radiation of respective lamps that strikes said radiation detector relative to one another can be adjusted by means of a mechanism that can vary a cross-sectional area of a respective radiation channel.

10. An apparatus according to claim 1, wherein said channel member, with said radiation channels, extends to said radiation sources.

11. An apparatus according to claim 1, wherein at least one light transmissive intermediate element, which extends at least one of said radiation channels, is disposed between at least one outlet opening of said radiation channel and an associated radiation source.

12. Apparatus according to claim 11, wherein said intermediate element in common extends a plurality of radiation channels.

13. An apparatus according to claim 11, wherein said intermediate element is a quartz or sapphire element.

14. An apparatus according to claim 1, wherein a cylindrical lens is disposed between said radiation detector and ends of said radiation channels that face said radiation detector.

15. An apparatus according to claim 1, wherein said radiation sources comprise at least one filament having an at least partially coiled filament structure.

16. An apparatus according to claim 15, wherein the filament structure of said radiation sources results in a predefined geometric and spectral radiation profile.

17. An apparatus according to claim 16, wherein said filament of said radiation source has an alternating coiled and uncoiled filament structure.

18. An apparatus according to claim 16, wherein said radiation source has two individually controllable filaments.

19. An apparatus according to claim 15, wherein a density of at least one filament structure varies along said filament.

20. An apparatus according to claim 1, wherein said radiation source comprises at least one halogen lamp or at least one arc lamp.

21. An apparatus according to claim 1, wherein said radiation sources and said radiation channels are arranged relative to one another such that said single radiation detector generates a signal that is free of influences from filament holding mechanisms.

22. A rapid heating system for the thermal treatment of semiconductor substrates, comprising:
   at least two radiation sources for heating the semiconductor substrates; at least one radiation detector for measuring electromagnetic radiation emitted from said at least two radiation sources; and
   a channel member having separate radiation channels to provide a radiation path between said radiation sources and said radiation detector, which is common to all of said radiation sources.

23. An apparatus according to claim 22, which includes a reaction chamber within which is effected thermal treatment of a semiconductor substrate, said reaction chamber essentially comprising a material that is transparent for the electromagnetic radiation of said radiation sources and for a spectrum of measurement wavelengths of said single radiation detector.

24. An apparatus according to claim 23, wherein said transparent material is at least one of the group consisting of quartz glass and sapphire.

25. An apparatus according to claim 23, wherein said material has an absorption coefficient, averaged over a lamp spectrum, between 0.001 $cm^{-1}$ and 0.1 $cm^{-1}$.

26. An apparatus according to claim 23, wherein said reaction chamber has a wall thickness of between 1 mm and 5 cm.

27. An optical radiation measurement apparatus comprising:
   at least two radiation sources;
   at least one radiation detector for measuring electromagnetic radiation emitted from said at least two radiation sources;
   a channel member in which are provided separate radiation channels to provide a radiation path between said radiation sources and said radiation detector, which is common to all of said radiation sources, wherein at least one wall of said radiation channels is structured; and means for varying the cross-sectional area of at least one of said radiation channels.

28. An optical radiation measurement apparatus comprising:

at least two radiation sources;

at least one radiation detector for measuring electromagnetic radiation emitted from said at least two radiation sources;

a channel member in which are provided separate radiation channels to provide a radiation path between said radiation sources and said radiation detector, which is common to all of said radiation sources;

at least one light transmissive intermediate element, which extends through at least one of said radiation channels, is disposed between at least one outlet opening of said radiation channels and an associated radiation source.

* * * * *